United States Patent
Shimada

(10) Patent No.: US 8,943,669 B2
(45) Date of Patent: Feb. 3, 2015

(54) ASSEMBLY METHOD FOR VACUUM PROCESSING APPARATUS

(75) Inventor: Koichi Shimada, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 490 days.

(21) Appl. No.: 13/282,876

(22) Filed: Oct. 27, 2011

(65) Prior Publication Data

US 2012/0118229 A1    May 17, 2012

(30) Foreign Application Priority Data

Nov. 12, 2010    (JP) ................. 2010-254093

(51) Int. Cl.
  B23P 11/00    (2006.01)
  C23C 14/00    (2006.01)
  C23C 16/44    (2006.01)
  H01L 21/67    (2006.01)

(52) U.S. Cl.
  CPC ....... *C23C 16/4412* (2013.01); *H01L 21/67178* (2013.01)
  USPC .......................... 29/525.01; 118/50

(58) Field of Classification Search
  CPC ................ H01L 21/67178; C23C 16/4412
  USPC ................ 29/525.01; 118/50, 723 VE, 719
  See application file for complete search history.

(56) References Cited

U.S. PATENT DOCUMENTS

| | | | | |
|---|---|---|---|---|
| 5,578,132 A | * | 11/1996 | Yamaga et al. | 118/724 |
| 5,871,813 A | * | 2/1999 | Pham | 427/248.1 |
| 7,559,350 B2 | * | 7/2009 | Uematsu | 156/382 |
| 2008/0226820 A1 | * | 9/2008 | Furuya | 427/255.36 |
| 2009/0008369 A1 | * | 1/2009 | Nozawa et al. | 219/121.54 |
| 2010/0247763 A1 | * | 9/2010 | Coutu et al. | 427/248.1 |

FOREIGN PATENT DOCUMENTS

| | | |
|---|---|---|
| CN | 101694210 A | 4/2010 |
| JP | 08-195332 A | 7/1996 |
| JP | 2010-239142 A | 10/2010 |

* cited by examiner

*Primary Examiner* — Jermie Cozart
(74) *Attorney, Agent, or Firm* — Nath, Goldberg & Meyer; Jerald L. Meyer

(57) ABSTRACT

The disclosure provides an assembly method of a vacuum processing apparatus having a reaction vessel and an exhaust port that are made of quartz and airtightly connected to each other, in order to prevent breakage of the vessel. The method includes (a) mounting an attachment member on one end portion of the reaction vessel, (b) connecting and fixing at least a flange portion of an exhaust pipe to the exhaust port, (c) fixing the attachment member to a portion of the exhaust pipe including at least the flange portion connected and fixed to the exhaust port by using fixing members after (a) and (b), (d) fixing the attachment member to a support portion after (a), and (e) fixing the exhaust pipe to an exhaust pipe fixing portion different from the attachment member at a lower position than a fixing position of the attachment member after completing (a) to (d).

8 Claims, 17 Drawing Sheets

ASSEMBLY METHOD FOR VACUUM PROCESSING APPARATUS

CROSS-REFERENCE TO RELATED APPLICATION

This application claims the benefit of Japanese Patent Application No. 2010-254093, filed on Nov. 12, 2010, in the Japanese Patent Office, the disclosure of which is incorporated herein in its entirety by reference.

TECHNICAL FIELD

The present disclosure relates to a vacuum processing apparatus including a reaction vessel made of quartz and an assembly method of the vacuum processing apparatus.

BACKGROUND

As a batch type apparatus which performs a vacuum process such as a film forming process on a semiconductor wafer (hereinafter, referred to as a "wafer"), there is known a vertical heat treatment apparatus including a wafer boat in which a plurality of wafers are stacked in the form of shelves, and a reaction tube (reaction vessel) which is formed of quartz and into which the wafer boat is airtightly inserted from the bottom thereof. For example, on the side surface of the reaction tube, one end portion of an exhaust port formed of quartz to vacuum-evacuate the reaction tube is thermally bonded to the reaction tube, and the other end portion of the exhaust port is connected to an exhaust pipe made of metal and extending toward a vacuum pump. An end portion of the exhaust pipe on the side of the exhaust port is fixed to, e.g., a housing forming an outer casing of the apparatus such that although an inner atmosphere of the reaction tube is set to be a vacuum atmosphere, the exhaust pipe is not pulled (moved) toward the atmosphere. Further, in order that a peripheral portion of a lower end portion of the reaction tube is in airtight contact with an upper surface of a lid installed at a lower end portion of the wafer boat in a circumferential direction, the reaction tube is fixed to a base plate while being maintained horizontally from the lower surface side thereof by a bottom flange serving as a ring-shaped attachment member at a position lower than a position at which the wafers are stacked in the wafer boat. Accordingly, a positional relationship between the position at which the end portion of the exhaust port on the side of the exhaust pipe is fixed and the position at which the lower end portion of the reaction tube is fixed is approximately determined in the apparatus.

When mounting the reaction tube on the apparatus or exchanging the reaction tube, the reaction tube is fixed to the bottom flange while the bottom flange is moved down, and then the bottom flange is fixed to the base plate while the bottom flange is moved up such that the other end portion of the exhaust port faces the open end portion of the exhaust pipe. Subsequently, for example, an operator airtightly connects the exhaust port with the exhaust pipe using a flange member for piping. Accordingly, the reaction tube is airtightly connected to the exhaust pipe.

However, since a quartz product has poor fabricability compared to, e.g., a metal material, the quartz product may have low fabrication accuracy. Accordingly, a length dimension of the exhaust port, a direction of the exhaust port extending from the reaction tube, or the like may be changed for each reaction tube. Since a positional relationship between the exhaust pipe and the lower end portion (bottom flange) of the reaction tube is determined in the apparatus as described above, when connecting the exhaust port to the exhaust pipe, excessive force may be applied to the exhaust port, thereby causing breakage of the reaction tube in the thermally bonded portion between the exhaust port and the reaction tube.

The exhaust pipe is divided into a first pipe on the side of the exhaust port and a second pipe on the side of the vacuum pump, and a certain amount of margin is provided in a bolt hole in which a member for fixing the first pipe to the housing, e.g., a bolt, is inserted. Further, the first pipe and the second pipe are airtightly connected to each other by a bendable, expansible and contractible bellows such that a fixing position of the first pipe can be adjusted according to the posture of the exhaust port. However, since a fixing operation of the first pipe or the exhaust port is performed at a higher position (over the head of an operator), the exhaust port may be fixed at a deviated position with respect to the exhaust pipe, and similarly, an excessive force may be applied to the exhaust port. In this case, although a position deviation of the exhaust pipe with respect to the exhaust port is very small, since the thermally bonded portion of the reaction tube and the exhaust port is spaced from the fixing position, the exhaust port may be further deviated from its position as it goes to the thermally bonded portion, thereby applying a large force to the thermally bonded portion. Further, when there is a very large dimensional error of the reaction tube or the exhaust port, even though the above-described margin is provided, it may be impossible to absorb the dimensional error, and excessive force may be applied to the exhaust port.

Meanwhile, for example, when the above-mentioned bellows is installed between the first pipe and the exhaust port such that the bellows can move according to the position of the exhaust port, the bellows is contracted when a vacuum atmosphere is set in the reaction tube. Accordingly, the exhaust port is pulled toward the exhaust pipe and the exhaust port may be deviated from the reaction tube (broken). Although a vertical heat treatment apparatus is known as a conventional technology, the above-described problem has not been addressed.

The objective of the present disclosure is to provide a vacuum processing apparatus and an assembly method of the vacuum processing apparatus which includes a reaction vessel made of quartz to prevent the breakage of the reaction vessel.

SUMMARY

One embodiment of the present disclosure provides an assembly method of a vacuum processing apparatus which performs a vacuum process on a substrate in a depressurized atmosphere in a reaction vessel being made of quartz and having one end portion open as a loading port of the substrate and an exhaust port formed at the one end portion, and said method comprises (a) mounting an attachment member on the one end portion of the reaction vessel, (b) connecting and fixing at least a flange portion of an exhaust pipe to the exhaust port, (c) fixing the attachment member to a portion of the exhaust pipe including at least the flange portion connected and fixed to the exhaust port by using fixing members after (a) mounting and (b) connecting and fixing, (d) fixing the attachment member to a support portion after (a) mounting the attachment member on the reaction vessel, and (e) fixing the exhaust pipe to an exhaust pipe fixing portion different from the attachment member at a lower position than a fixing position of the attachment member after completing (a) mounting to (d) fixing.

Another embodiment of the present disclosure provides a vacuum processing apparatus which performs a vacuum process on a substrate in a depressurized atmosphere in a reaction vessel being made of quartz and having one end portion open as a loading port of the substrate and an exhaust port formed at the one end portion, wherein the apparatus includes an attachment member which is mounted on the one end portion of the reaction vessel, a flange portion of an exhaust pipe which is fixed to the exhaust port, and fixing members which fix the attachment member to a portion of the exhaust pipe including at least the flange portion connected and fixed to the exhaust port.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
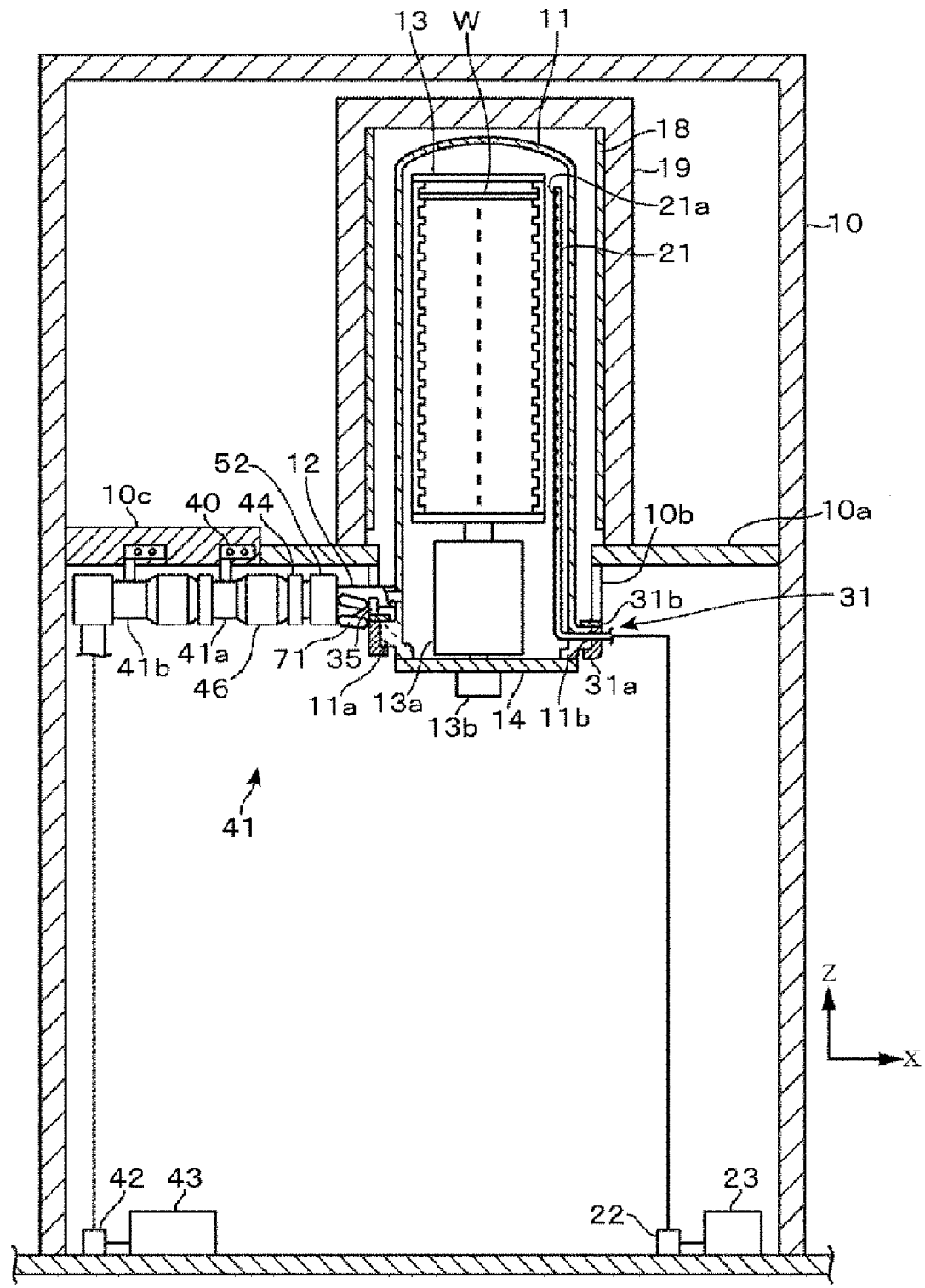
FIG. 1 is a longitudinal cross-sectional view showing a vacuum processing apparatus according to an exemplary embodiment of the present disclosure.

A vertical heat treatment apparatus that is a vacuum processing apparatus according to an exemplary embodiment of the present disclosure will be described with reference to FIGS. 1 to 10. The vertical heat treatment apparatus includes a vertical reaction tube (reaction vessel) 11 which is formed of quartz and accommodates wafers W to perform a vacuum process (a film forming process in this embodiment) on the wafers W, and an exhaust port 12 which is formed of quartz and airtightly fixed (thermally bonded) to an outer peripheral surface of the reaction tube 11 to vacuum evacuate the reaction tube 11. Further, the exhaust port 12 is fixed to the apparatus (specifically, a bottom flange 31 and a flange member 52 which will be described later) while preventing a large force from being applied to a portion thermally bonded to the reaction tube 11 (i.e., breakage). Before explaining a method of fixing the exhaust port 12, as a main component of the present disclosure, to the apparatus, the entire configuration and each component of the apparatus will be described in detail below.

A heating furnace main body 19 is installed at the outside of the reaction tube 11, and a heater 18 serving as a heating unit is disposed on an inner wall surface of the heating furnace main body 19 in a circumferential direction. A lower end portion of the heating furnace main body 19 is supported by a base plate 10a in a circumferential direction. Reference numeral 10 of FIG. 1 denotes a housing (apparatus main body) forming an outer casing installed at an outer surface of the vertical heat treatment apparatus to support the reaction tube 11. The base plate 10a serving as a support portion forms a part of the housing 10. The reaction tube 11 is formed in an approximately cylindrical shape to have a ceiling surface protruding upward and a lower open end portion. Further, an outer peripheral surface of the lower end portion of the reaction tube 11 horizontally extends in a flange shape in a circumferential direction toward the outside to form a flange portion 11a supporting the reaction tube 11. Further, an inner peripheral side of the flange portion 11a extends inward in a circumferential direction to be in airtight contact with an upper surface of a lid 14 that will be described later, thereby forming a seal portion 11b for hermetically sealing an inner region of the reaction tube 11.

Installed in the reaction tube 11 are a wafer boat 13 serving as a substrate holder in which a plurality of wafers W are stacked in form of shelves, and a gas injector 21 arranged in a in a longitudinal direction of the wafer boat 13. The wafer boat 13 is configured to be vertically movable by a boat elevator (not shown) together with the lid 14 having an approximately circular plate shape installed at the lower end portion of the wafer boat 13. Installed at a peripheral portion of the upper surface of the lid 14 is, e.g., an O ring as a ring-shaped seal member which is formed of an organic material with elasticity (not shown) and in airtight contact with the seal portion 11b in a circumferential direction in order to hermetically seal the reaction tube 11. Reference numeral 13a of FIG. 1 denotes an insulator having an approximately cylindrical shape installed between the wafer boat 13 and the lid 14. Reference numeral 13b of FIG. 1 denotes a motor installed below the lid 14 to rotate the wafer boat 13 around a vertical axis.

A lower end portion of the gas injector 21 airtightly passes through a sidewall (flange portion 11a) of the reaction tube 11 to be connected to a processing gas source 23 containing a film forming gas, e.g., a silane gas, via a flow control unit 22. Reference numeral 21a of FIG. 1 denotes gas holes formed on a side surface of the gas injector 21 at each loading position of the wafers W in the wafer boat 13. Further, the wafer boat 13 and the gas injector 21 are schematically illustrated in FIG. 1.

The reaction tube 11 is horizontally fixed to the base plate 10a by the bottom flange 31 forming an attachment member at a position, e.g., about 2 m, higher than a bottom surface level of the reaction tube 11 such that the wafer boat 13 can be inserted into the reaction tube 11 from the bottom. That is, the bottom flange 31 includes, as shown in FIG. 2, a lower member 31a and an upper member 31b into which the flange portion 11a is inserted in a circumferential direction from both upper and lower sides of the flange portion 11a, and fixing portions 31c such as bolt holes formed at equal intervals in, e.g., three locations in a circumferential direction on the upper surface of the upper member 31b to suspend the bottom flange 31 (reaction tube 11) from the upper side of the heating furnace main body 19.

Figure 2:
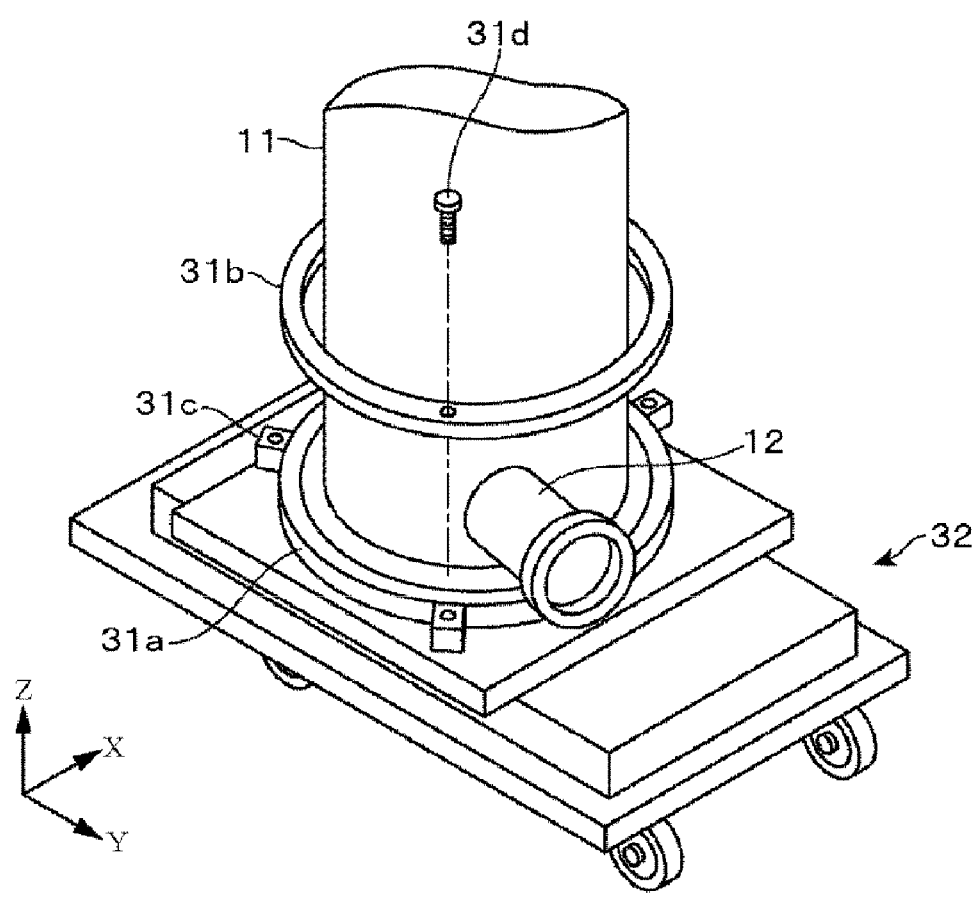
FIG. 2 is an enlarged perspective view showing a portion of the vacuum processing apparatus.
Figure 3:
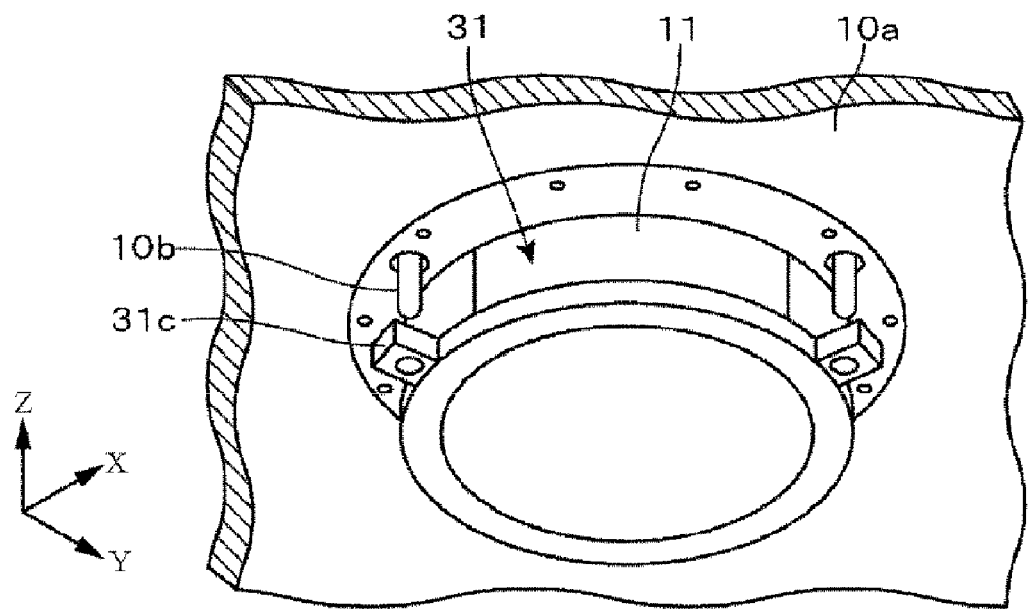
FIG. 3 is an enlarged perspective view showing a portion of the vacuum processing apparatus.

Further, while the members 31a and 31b are fixed to each other by bolts 31d as shown in FIGS. 2 and 3, the fixing portions 31c are fastened to support shafts 10b vertically extending towards each fixing portions 31c of the bottom flange 31 from the lower surface of the base plate 10a, so that the reaction tube 11 is fixed while it is horizontally suspended from the base plate 10a, as shown in FIG. 3. Reference numeral 32 of FIG. 2 denotes a tube cart configured to be horizontally movable by, e.g., an operator. The reaction tube 11 is configured to be vertically movable between a height level at which the reaction tube 11 is fixed to the base plate 10a (a vacuum process is performed on the wafers W) and a position at which the reaction tube 11 is removed from the apparatus or exchanged with another one (a height level of a bottom surface). Further, FIG. 2 is a view, seen from above, illustrating the reaction tube 11 located at the level of the bottom surface, and FIG. 3 is a view, seen from below, illustrating the reaction tube 11 located at the height position at which the reaction tube 11 is fixed to the base plate 10a. Further, in FIG. 2, the illustration of shafts 71 that will be described later is not shown.

Figure 4:
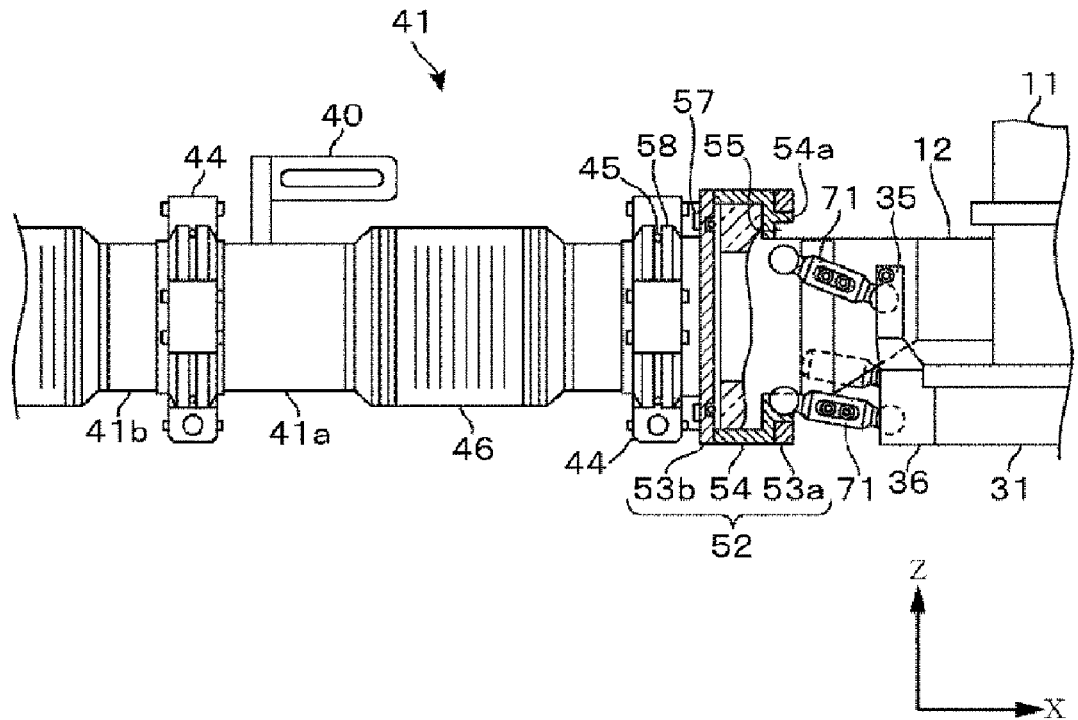
FIG. 4 is an enlarged side view showing a portion of an exhaust pipe installed in the vacuum processing apparatus.
Figure 5:
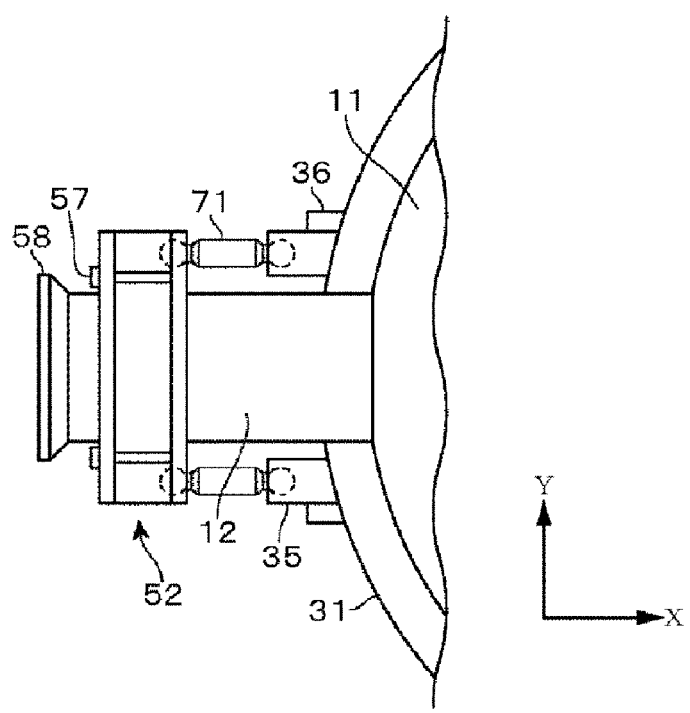
FIG. 5 is an enlarged longitudinal plan view showing a portion of the exhaust pipe.
Figure 10:
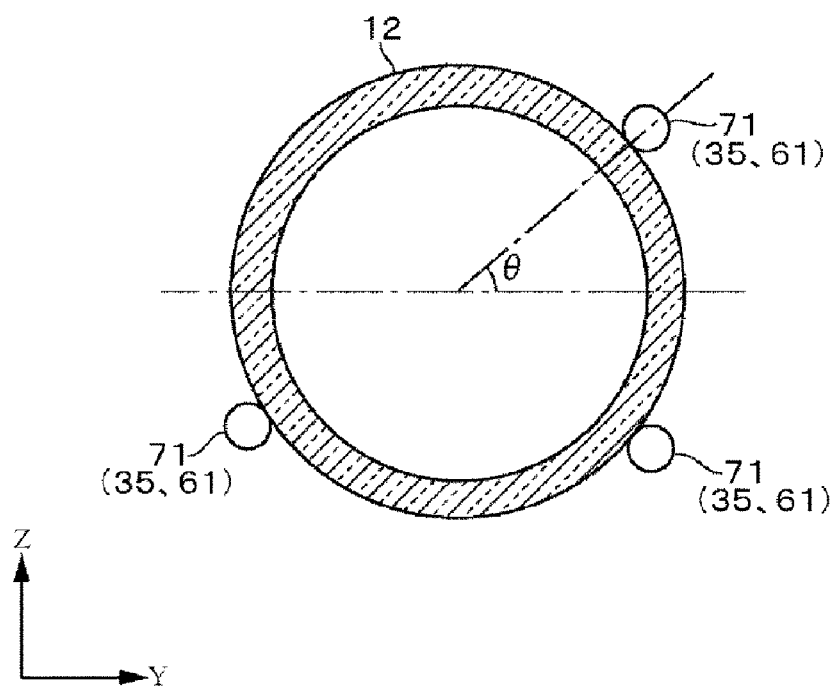
FIG. 10 is a longitudinal cross-sectional view showing the exhaust pipe.

As shown in FIGS. 4 and 5, fixing portions 35 for fixing one end portions of the shafts 71 serving as fixing members to be described later are installed at a plurality of locations (three locations in this embodiment) at a peripheral surface of the exhaust port 12 on the bottom flange 31. As shown in FIGS. 5 and 10, the fixing portions 35 are arranged at two locations vertically at one side of the exhaust port 12 (right side of FIG. 10) and one location at the other side (left side of FIG. 10) when the exhaust port 12 is seen from above. The fixing portions 35 will be described later together with the shafts 71. Reference numeral 36 of FIG. 4 denote a base plate supporting the fixing portions 35 from the bottoms thereof to fix the fixing portions 35 to the bottom flange 31.

Figure 6:
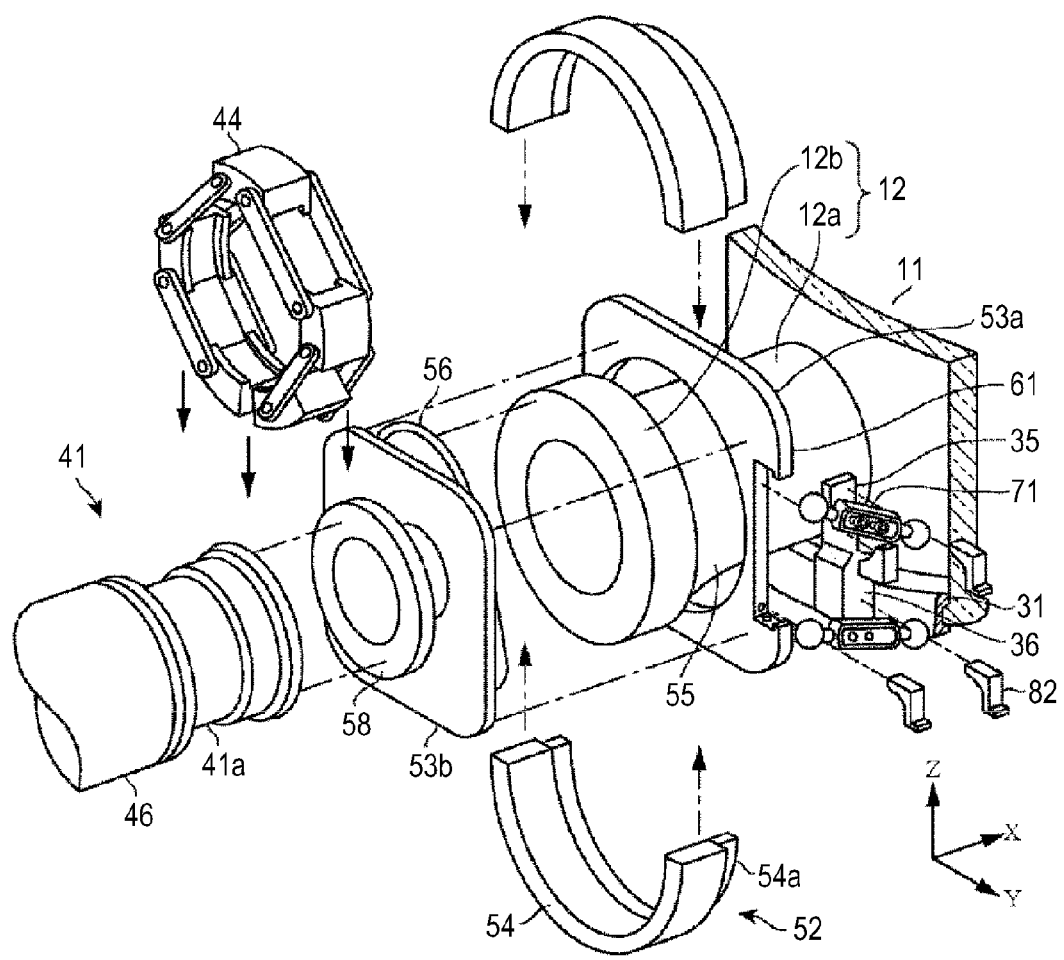
FIG. 6 is an enlarged exploded perspective view showing a portion of the exhaust pipe.

Subsequently, the exhaust port 12 and an exhaust pipe (piping member) 41 connected to the exhaust port 12 will be described in detail. The exhaust port 12 includes, as shown in FIG. 6, a port main body 12a which is installed at a region adjacent to a lower end portion of the reaction tube 11, and formed in an approximately cylindrical shape while one end portion of the port main body 12a is connected (thermally bonded) to the reaction tube 11, and a flange portion 12b configured such that a peripheral portion of the other end portion of the port main body 12a extends outward in a circumferential direction. A diameter dimension of an outer peripheral surface of the port main body 12a in a circumferential direction is, e.g., 3 inches (about 75 mm) to 4 inches (about 100 mm). One end portion of the exhaust pipe (piping member) 41 is arranged adjacent to an opening of the flange portion 12b, and the flange member 52 is installed in order to airtightly connect the flange portion 12b (exhaust port 12) with the exhaust pipe 41. Further, in order to suppress breakage of a thermally bonded portion of the exhaust port 12 and the reaction tube 11, the shafts 71, which are fixing members as an essential part of the present disclosure, are installed to fix the flange member 52 to the bottom flange 31 installed on the surface of a lower end portion of the reaction tube 11. First, the flange member 52 will be described below.

Figure 7:
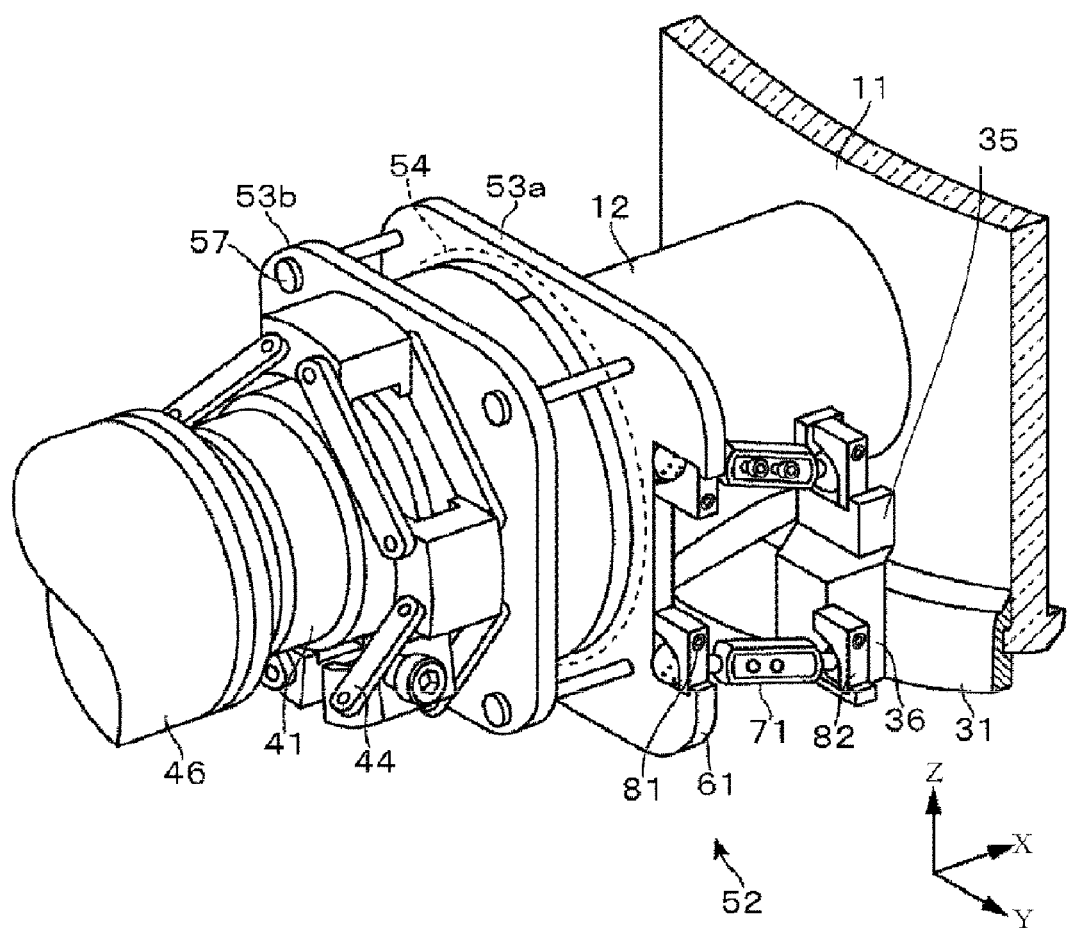
FIG. 7 is a perspective view showing a portion of the exhaust pipe.

The flange member 52 includes two plate-shaped members 53a and 53b having an approximately rectangular shape and separated from each other to face each other in a longitudinal direction of the exhaust port 12 as shown in FIG. 6. In the two plate-shaped members 53a and 53b, reference numeral 53a is assigned to the plate-shaped member 53a on the side of the exhaust port 12 and reference numeral 53b is assigned to the plate-shaped member 53b on the side of the exhaust pipe 41. A circular through hole 55 is formed at a central portion of the plate-shaped member 53a such that an opening dimension of the through hole 55 is larger than an outer diameter dimension of the flange portion 12b. Further, in the plate-shaped member 53a, an upper end portion and a lower end portion of a front sidewall in a Y direction in FIG. 6 and a lower end portion of a rear sidewall in the Y direction in FIG. 6 extend in a horizontal direction, thereby partially forming fixing portions 61 for fixing one end portion of each shafts 71. A flange portion 58 is formed on the side of the exhaust pipe 41 of the plate-shaped member 53b such that an inner region of the flange portion 58 communicates with the exhaust port 12. Further, FIGS. 6 and 7 are partially cutaway views of the reaction tube 11, wherein FIG. 6 illustrates a state in which the exhaust port 12 is separated from the flange member 52, and FIG. 7 illustrates a state in which the exhaust port 12 is connected to the flange member 52.

Provided between the plate-shaped members 53a and 53b are two split type collar members 54 formed in an appropriately circular arc shape along an outer edge of the flange portion 12b when viewed in a longitudinal direction of the exhaust port 12 such that the flange portion 12b is inserted between upper and lower sides of the collar members 54. As shown in FIG. 4, the collar members 54 are configured such that the diameter of the end portions of the collar members 54 (diameter reducing portions 54a) on the side of the reaction tube 11 is smaller than the diameter of the outer peripheral portion of the flange portion 12b and the diameter reducing portions 54a are received into the through hole 55 of the plate-shaped member 53a. Accordingly, the plate-shaped member 53a is arranged such that the flange portion 12b and the port main body 12a are inserted into the through hole 55, and then the collar members 54 are arranged to insert the flange portion 12b between upper and lower sides of the collar members 54. At the same time, the plate-shaped member 53a is moved toward the collar members 54. Consequently, an inner peripheral surface of the plate-shaped member 53a is engaged with inner peripheral surfaces of the collar members 54. Further, the exhaust port 12 is airtightly connected to the flange member 52 by fastening the plate-shaped members 53a and 53b in a circumferential direction from the outer peripheral side by bolts 57 while a seal member 56 such as an O ring is interposed between the plate-shaped members 53a and 53b. Further, the collar member 54 is omitted in FIG. 7 to schematically show the flange portion 12b, and the bolts 57 are omitted in FIG. 6. Further, FIG. 4 illustrates a cross-sectional view of a part of the flange member 52.

Subsequently, the shafts 71 for fixing the flange member 52 to the bottom flange 31 will be described in detail below. In this case, since both the reaction tube 11 and the exhaust port 12 are formed of quartz, fabrication accuracy may be lower than that when using a metal material. Accordingly, for example, a length dimension of the exhaust port 12 or a direction of the exhaust port 12 extending from the reaction tube 11 may be changed in each reaction tube 11 (exhaust port 12). Thus, the shafts 71 are configured to fix the bottom flange 31 and the flange member 52 to each other regardless of fabrication accuracy of the reaction tube 11 or the exhaust port 12, i.e., to fix the bottom flange 31 and the flange member 52 to each other according to the posture of the exhaust port 12 with respect to the reaction tube 11.

Figure 8:
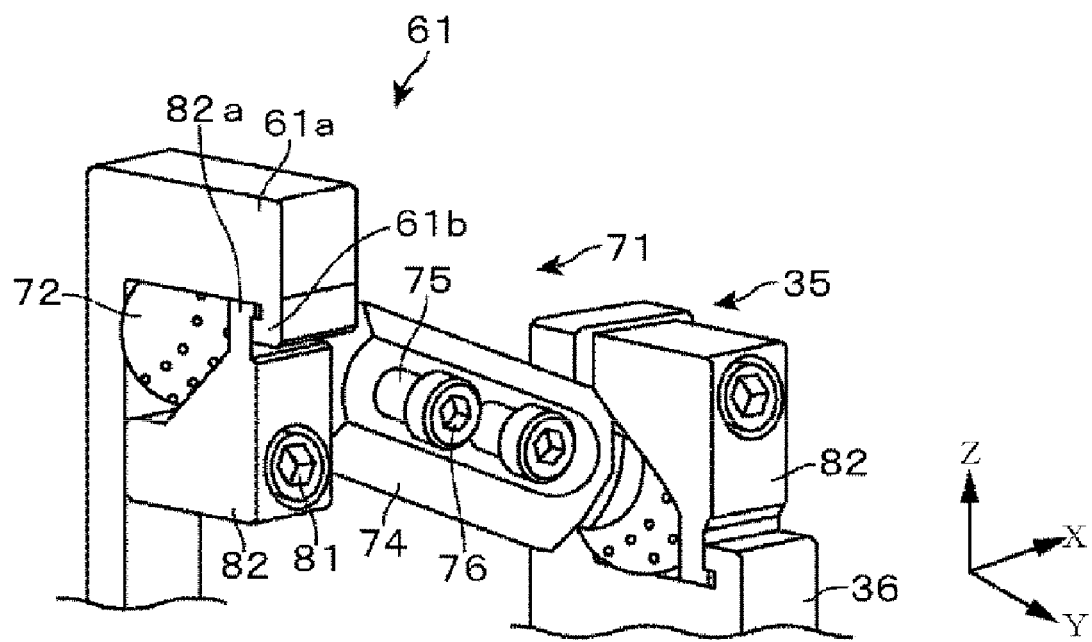
FIG. 8 is a perspective view showing a shaft serving as a member for fixing the exhaust pipe.
Figure 9:
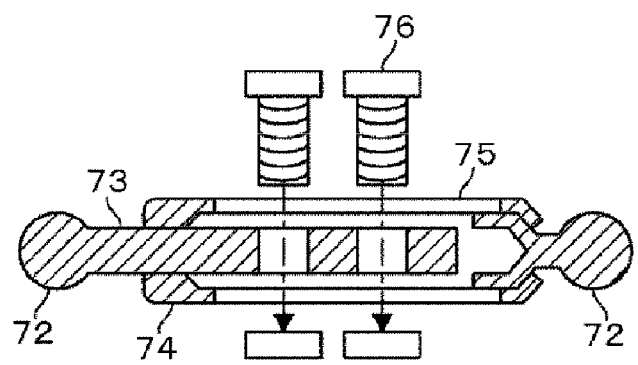
FIG. 9 is a longitudinal cross-sectional view schematically showing the shaft.

That is, the shafts 71 have an adjustable length dimension and both end portions of each of the shafts 71 have a ball joint structure. Specifically, as shown in FIGS. 8 and 9, the shaft 71 includes spherical ball members 72 installed at each end portion in a longitudinal direction, and a shaft main body 74 formed in an approximately cylindrical shape between the ball members 72. The ball member 72 on one side (right side in FIG. 9) is fixed to the shaft main body 74. Further, the ball member 72 on the other side (left side in the FIG. 9) is connected to a reciprocating shaft 73 extending in a longitudinal direction of the shaft main body 74 in an inner region of the shaft main body 74 to protrude from or retract into the shaft main body 74 by the reciprocating shaft 73. On the side surface of the shaft main body 74, fixing holes 75 are arranged at two locations to face each other in the longitudinal direction of the shaft main body 74. The reciprocating shaft 73 is configured to be fixed from the lateral side (vertically) by bolts 76 through the fixing holes 75. Accordingly, it is possible to adjust the length dimension between the ball members 72 by making the reciprocating shaft 73 protrude from or retract into the shaft main body 74 and then fixing the reciprocating shaft 73 using the bolts 76.

Subsequently, the fixing portions 35 and 61 for fixing the ball members 72 (shafts 71) to the bottom flange 31 and the flange member 52 respectively will be described. In this case, since the fixing portions 35 and 61 have almost the same configuration, the upper fixing portion 61 of the two fixing portions 61 at the front side in the Y direction in FIG. 6 will be described as an example. The fixing portion 61 is configured such that an outer surface of the ball member 72 can be supported at, e.g., three locations in order to adjust a connection (fixing) angle of the shaft 71 with respect to the fixing portion 61, i.e., to adjust the direction of the shaft 71 with respect to the fixing portion 61.

Specifically, the fixing portion 61 includes, as shown in FIGS. 7 and 8, a clamp member 82 fixed to the sidewall of the plate-shaped member 53a by a bolt 81. The surface of an upper end portion of the clamp member 82 is formed obliquely to face a horizontal portion 61a horizontally extending toward the front side in the Y direction in FIG. 8 from the upper end portion of the plate-shaped member 53a and a connection portion (rectangular portion) of the side surface of the plate-shaped member 53a extending downward from a base end portion of the horizontal portion 61a. Further, a leading end portion of the horizontal portion 61a extends vertically downward and is bent at a right angle toward the side surface of the plate-shaped member 53a, thereby forming a locking portion 61b. The upper end portion of the clamp member 82 facing the locking portion 61b is bent horizontally away from the side surface of the plate-shaped member 53a, thereby forming a locked portion 82a that is engaged with the locking portion 61b. Although not shown in the drawing, a portion supporting the ball member 72 in the horizontal portion 61a, the side surface of the plate-shaped member 53a and the upper end surface of the clamp member 82 is formed to be recessed in a spherical shape to slightly conform to the outer surface of the ball member 72 in order to support the ball member 72.

Further, while the ball member 72 is located in a region surrounded by the horizontal portion 61a, the side surface of the plate-shaped member 53a and the upper end portion of the clamp member 82, the locking portion 61b is engaged with the locked portion 82a by adjusting the direction of the shaft main body 74 extending from the ball member 72, thereby fixing one end portion of the shaft 71 to the fixing portion 61. The other fixing portions 61 and the fixing portions 35 of the bottom flange 31 are configured in the same way as the above-described fixing portion 61 and may fix the shafts 71 such that the directions of the shafts 71 can be adjusted.

Further, these sets (shafts 71) of the fixing portions 35 and the fixing portions 61 are arranged in a plurality of (three in this embodiment) locations, as shown in FIG. 10, to fix the bottom flange 31 and the flange member 52 to the outside of the exhaust port 12 in the circumferential direction. The sets of the fixing portions 35 and the fixing portions 61 are installed to be spaced from each other around an axis extending in the longitudinal direction of the exhaust port 12, and opposite to each other through the inner region of the exhaust port 12. Specifically, two sets are installed at two locations to face each other in a diameter direction of the exhaust port 12 and one set is installed to be spaced from the two sets in the circumferential direction of the exhaust port 12 when viewed from the longitudinal direction of the exhaust port 12. Accordingly, if an angle between a horizontal axis extending in a direction perpendicular to the longitudinal direction of the exhaust port 12 and each of the sets is θ, the angles θ of the sets are −45°, 45° and 225° respectively. Although a distance between the fixing portions 35 and 61 (length dimension of the shaft 71) varies according to the dimension error of the reaction tube 11 (exhaust port 12) as described above, the distance is short, e.g., 57 mm to 68.5 mm.

Next, the exhaust pipe 41 will be described. The exhaust pipe 41 includes, as shown in FIG. 1, a first exhaust pipe 41a having one end portion airtightly connected to the exhaust port 12, and a second exhaust pipe 41b which is airtightly connected to the other end portion of the first exhaust pipe 41a and extends toward a vacuum pump 43 via a pressure controller 42 such as a butterfly valve. These exhaust pipes 41a and 41b are fixed to a support plate (exhaust pipe fixing portion) 10c as a member different from the base plate 10a in support portions 40 by bolts or the like (not shown), respectively, with the support plate 10c being closer to the vacuum pump 43 than the base plate 10a. The support plate 10c forms a part of the housing 10. The first exhaust pipe 41a and the flange member 52 have open end portions formed in a flange shape to face each other. The open end portions are clamped to each other by a clamp member (clamp chain) 44 in a circumferential direction via a seal member 45 such as an O ring. Then, one end portion and the other end portion of the clamp member 44 are fixed to each other. Accordingly, the first exhaust pipe 41a is airtightly connected to the flange member 52. In the first exhaust pipe 41a, an expansible and contractible bellows member 46 is airtightly interposed between the support portion 40 and a connection portion with the exhaust port 12.

Similarly, the exhaust pipes 41a and 41b are fixed to each other by the clamp member 44 via the seal member 45 such as an O ring. In the second exhaust pipe 41b, the bellows member 46 is airtightly interposed between the support portion 40 and a connection portion with the first exhaust pipe 41a. Further, although a thermal insulator, a heater for heating gas flowing therein or the like is installed in the exhaust port 12 or the exhaust pipe 41, an illustration thereof is omitted.

Figure 11:
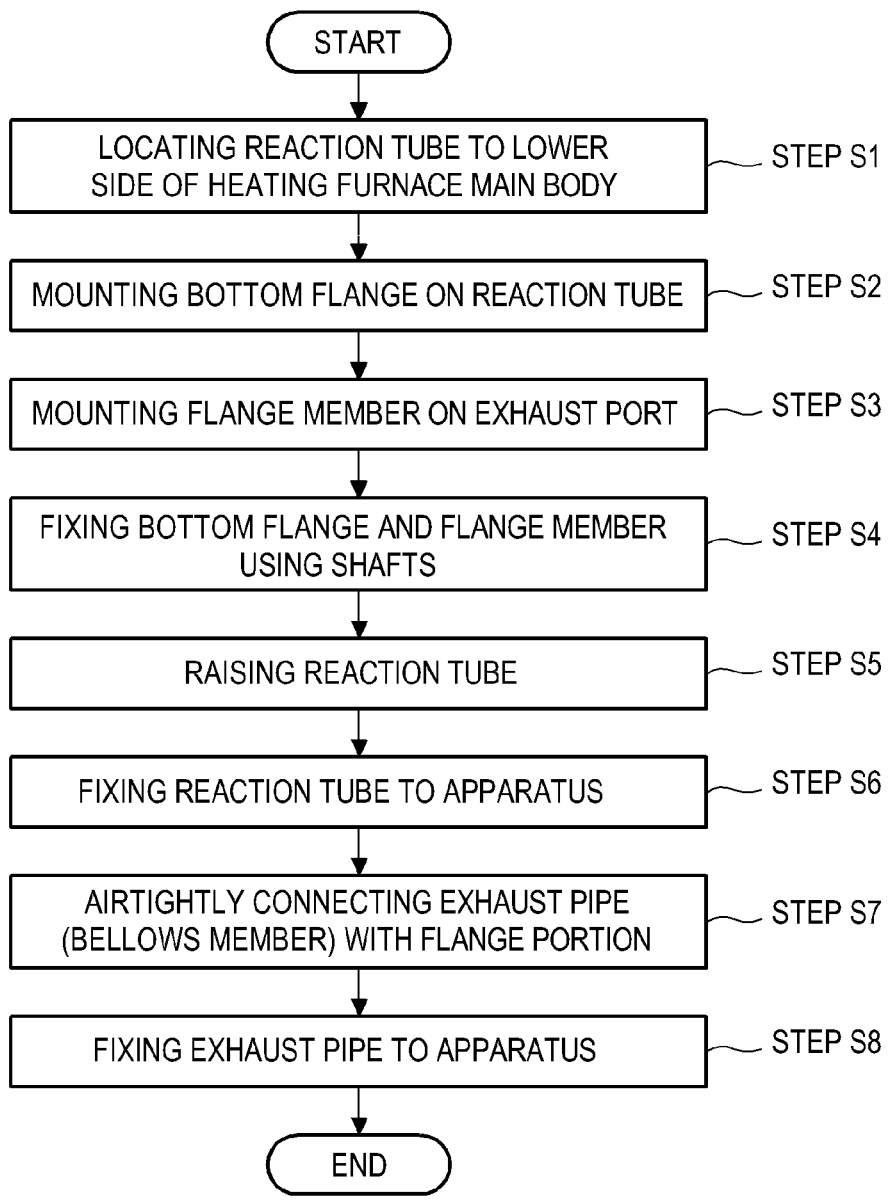
FIG. 11 is a flowchart showing an assembly method of the vacuum processing apparatus.
Figure 12:
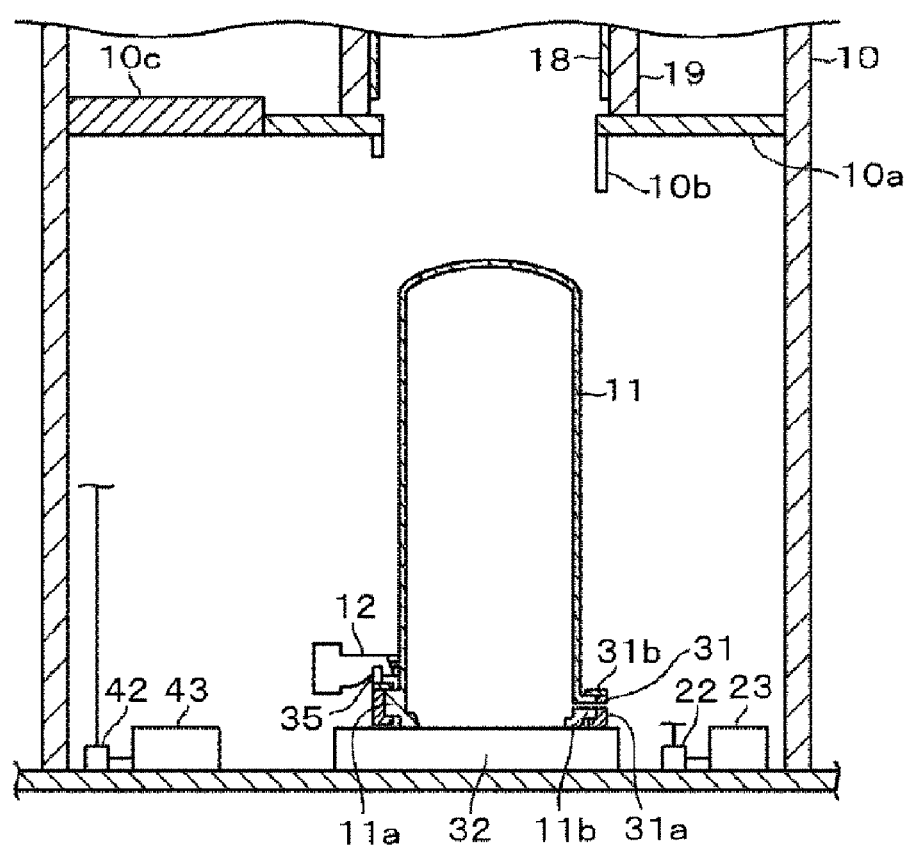
FIG. 12 schematically shows an operation in the vacuum processing apparatus.

Next will be described an assembly method of the vacuum processing apparatus according to the present disclosure in an operation when the reaction tube 11 is mounted on the apparatus (exchanged with another one). FIG. 11 illustrates a flowchart showing the assembly method. First, as shown in FIG. 12, the tube cart 32 on which the reaction tube 11 is loaded is introduced by, e.g., an operator into the apparatus in a state that the reaction tube 11 is removed, and the reaction tube 11 is located to the lower side of the heating furnace main body 19 (step S1). In this case, the exhaust pipes 41a and 41b and the bellows members 46 are removed from the housing 10. Then, as shown in FIG. 2, the bottom flange 31 is mounted on the flange portion 11a of the reaction tube 11 (step S2). That is, the lower member 31a is made in contact with the flange portion 11a from below, and then the upper member 31b is arranged on the upper side of the flange portion 11a, thereby fastening the members 31a and 31b to each other by the bolts 31d in the circumferential direction. Then, the base plate 36 is fixed to the bottom flange 31 and the fixing portions 35 are also fixed to the base plate 36.

Figure 13:
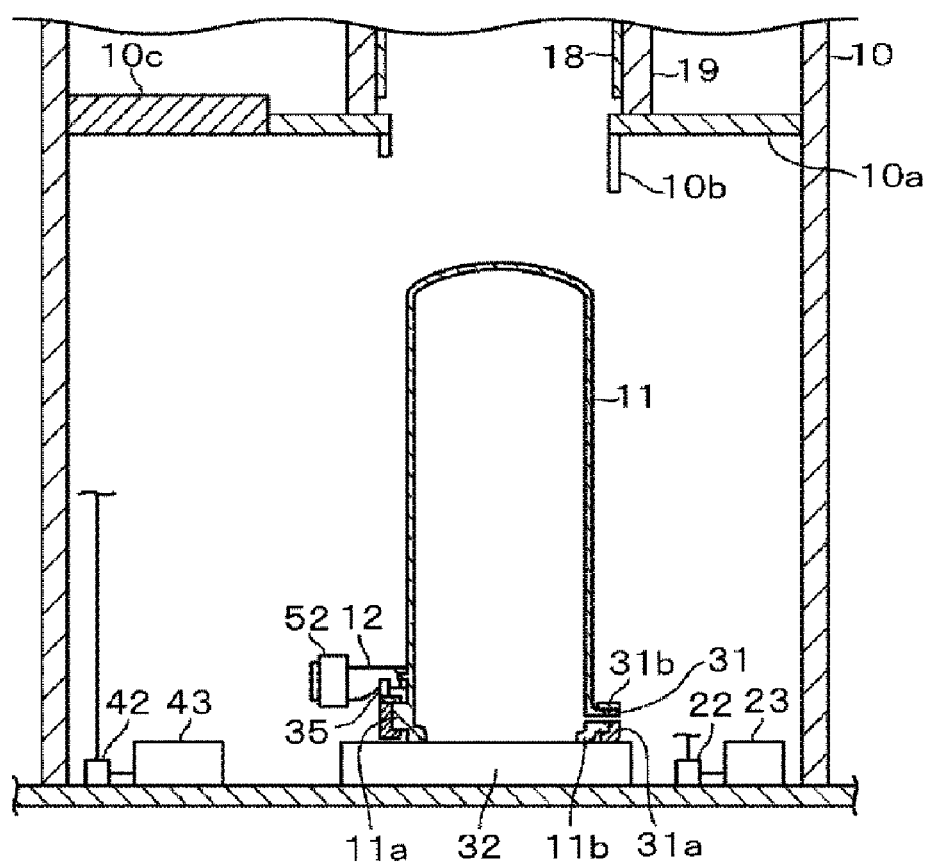
FIG. 13 schematically shows an operation in the vacuum processing apparatus.

Subsequently, as shown in FIG. 13, the flange member 52 is airtightly mounted on the exhaust port 12 as described above (step S3). The flange portion 58 (shown in FIG. 15) as an open end portion of the flange member 52 on the side of the exhaust pipe 41 is mounted in the direction facing the open end portion of the exhaust port 12 (flange portion 12b). The upper side of the apparatus is omitted in FIGS. 12 and 13. In the same way, the upper side of the apparatus will be omitted in FIGS. 14, 16 and 17.

Figure 14:
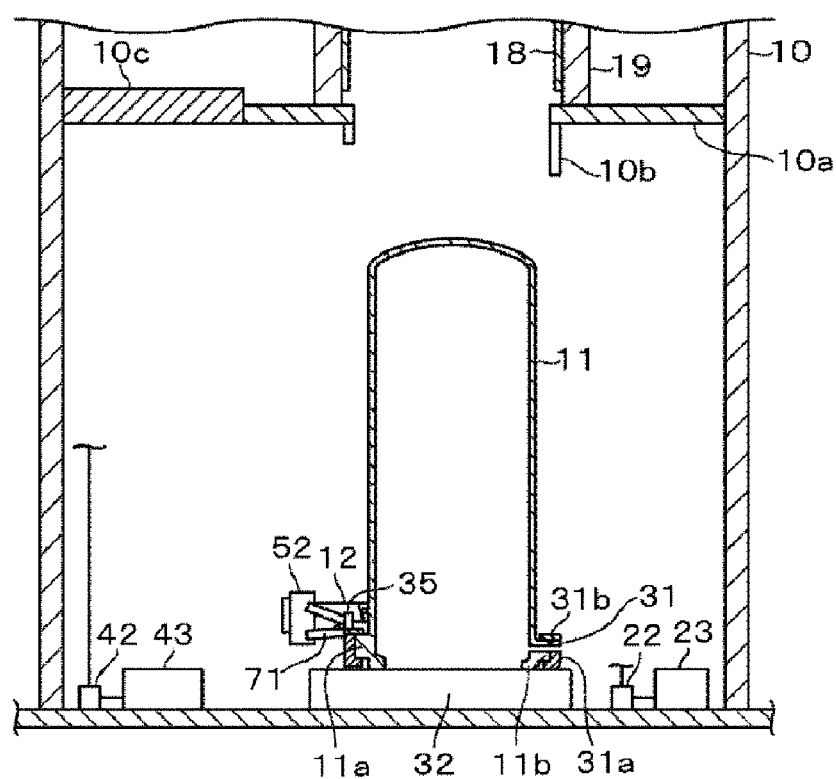
FIG. 14 schematically shows an operation in the vacuum processing apparatus.
Figure 15:
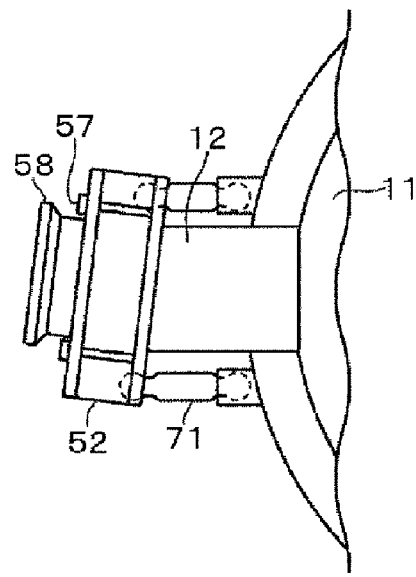
FIG. 15 is a plan view showing an operation in the vacuum processing apparatus.

Subsequently, as shown in FIG. 14, the bottom flange 31 and the flange member 52 are fixed to each other by using the shafts 71 (step S4). In this case, as described above, the flange member 52 is mounted in the direction facing the open end portion of the exhaust port 12. Accordingly, for example, in the case where the open end portion of the flange portion 12b is deviated laterally from the extending direction of the port main body 12a, as schematically shown in FIG. 15, the flange member 52 is mounted in the deviated direction. However, as described above, since the shafts 71 are expansible and contractible and the directions of the shafts 71 can be adjusted with respect to the bottom flange 31 and the flange member 52, the bottom flange 31 and the flange member 52 can be fixed to each other according to the posture of the exhaust port 12 with respect to the reaction tube 11.

Specifically, the length dimension of each of the shafts 71 is adjusted according to the distance between the fixing portions 35 and 61. Further, while adjusting the posture (angle) of each shaft 71 such that both end portions of the shaft 71 are arranged at the fixing portions 35 and 61 respectively, the clamp members 82 are fixed to the fixing portions 35 and 61 respectively, thereby fixing the flange member 52 to the bottom flange 31. In this way, three shafts 71 are sequentially arranged for fixation between the bottom flange 31 and the flange member 52. In this case, although the direction of the exhaust port 12 extending from the reaction tube 11 or the length dimension of the exhaust port 12 is different for each reaction tube 11 (exhaust port 12), the bottom flange 31 and the flange member 52 are fixed to each other by adjusting the length dimension and angle of the shafts 71 according to the reaction tube 11 and the exhaust port 12. FIG. 15 is an exaggerated view illustrating an inclination of the flange member 52.

Figure 16:
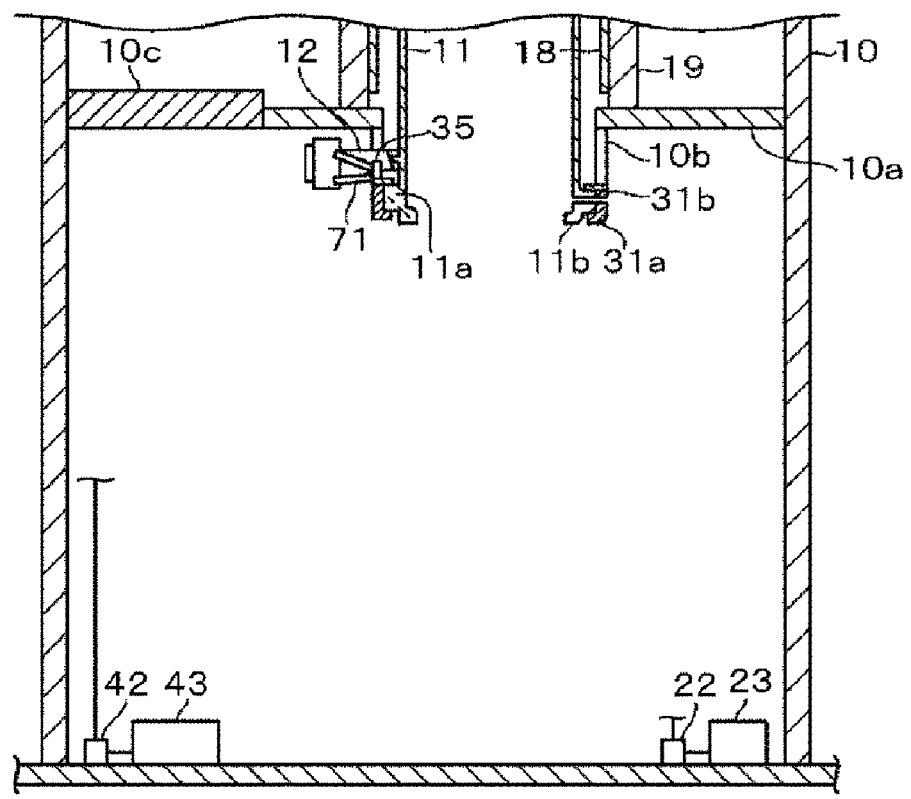
FIG. 16 schematically shows an operation in the vacuum processing apparatus.

Then, the reaction tube 11 is raised by using the tube cart 32 such that the open end portion of the exhaust port 12 faces the open end portion of the first exhaust pipe 41a (bellows member 46) (step S5). As shown in FIG. 16, the bottom flange 31 is fixed to the base plate 10a by the support shafts 10b (step S6). Accordingly, a positional relationship between the surface of the lower end portion (bottom flange 31) of the reaction tube 11 and the fixing portions (support portions 40) of the exhaust pipe 41 is almost fixed in the apparatus. The tube cart 32 is omitted in FIG. 16.

Figure 17:
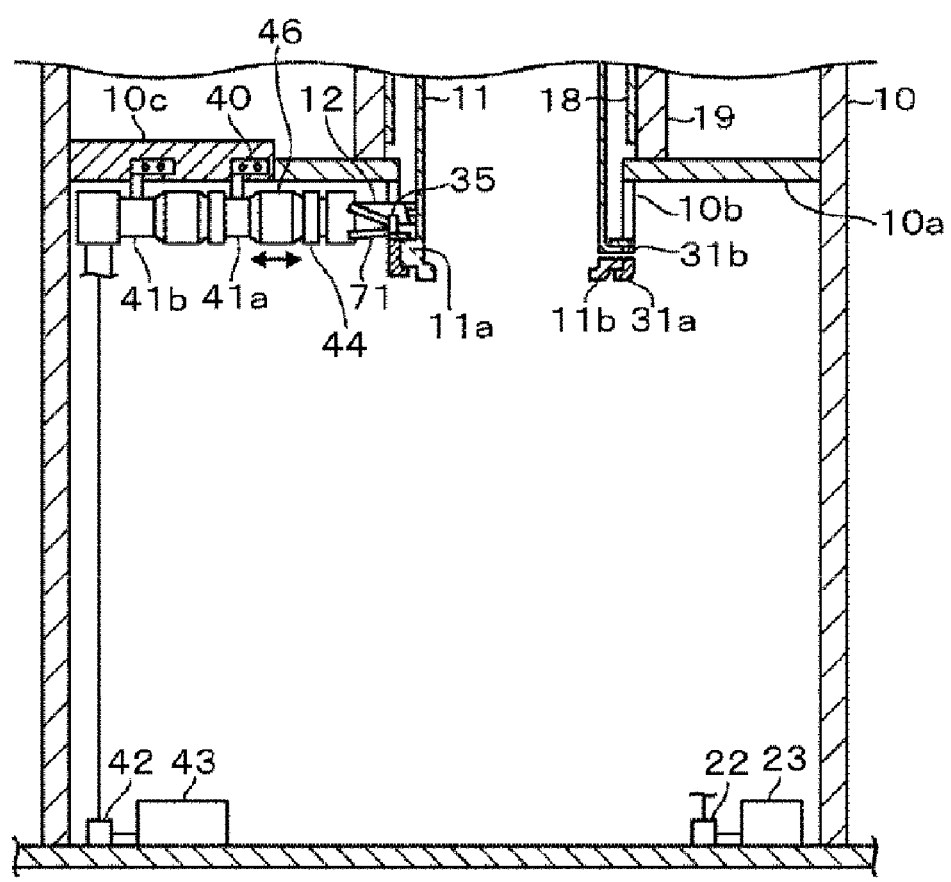
FIG. 17 schematically shows an operation in the vacuum processing apparatus.

Subsequently, as shown in FIG. 17, for example, the operator may make the open end portion of the bellows member 46 extending from the exhaust pipe 41 in contact with the open end portion of the flange member 52 (shown in FIGS. 4 to 6) over the head of the operator to airtightly connect the bellows member 46 with the flange portion 58 (shown in FIGS. 4 to 6) on the side of the exhaust port 12 using the clamp member 44 (step S7). Then, the exhaust pipe 41 (the first exhaust pipe 41a and the second exhaust pipe 41b) having one end portion connected to the vacuum pump 43 is fixed to the support plates 10c respectively (step S8). In this case, as described above, since the reaction tube 11 or the exhaust port 12 is formed of quartz with a relatively large dimensional error, the position or posture of the exhaust pipe 41 connected to the bellows member 46 may be different for each reaction tube 11. However, since the bellows member 46 is expansible and contractible, the exhaust pipe 41 (the first exhaust pipe 41a and the second exhaust pipe 41b) is fixed to the housing 10 (the support plates 10c) regardless of the position or posture of the exhaust pipe 41. Further, since the bottom flange 31 and the flange member 52 are already fixed to each other by the shafts 71, even though a large force is applied to the flange portion 58 by, e.g., the operator when the exhaust pipe 41 is fixed to the housing 10, it is possible to prevent an excessive load from being applied to the thermally bonded portion between the reaction tube 11 and the exhaust port 12.

Then, the tube cart 32 is unloaded from the apparatus, and the wafer boat 13 or the gas injector 21 is arranged in and connected to the apparatus, thereby completing an installation operation of the reaction tube 11 in the apparatus. Further, the wafers W are loaded in the wafer boat 13 from the outside by a transfer arm (not shown) installed at a position lower than the reaction tube 11. Then, while the wafer boat 13 is airtightly inserted in the reaction tube 11, an inner atmosphere of the reaction tube 11 is heated to, e.g., about several hundred degrees Celsius by the heater 18. Subsequently, a film forming process is performed on the wafers W by supplying a film forming gas to the reaction tube 11 while vacuumizing the reaction tube 11. In this case, since the expansible and contractible bellows member 46 is installed on the exhaust port 12 rather than the fixing portion (support portion 40) of the first exhaust pipe 41a to the housing 10, if the inside of the reaction tube 11 is set at a vacuum atmosphere, the bellows member 46 may be contracted in the longitudinal direction of the exhaust pipe 41. Accordingly, the exhaust port 12 may be pulled (moved) by the bellows member 46. However, since the flange member 52 on the side of the bellows member 46 rather than the exhaust port 12 is fixed to the bottom flange 31 through the shafts 71, it is possible to prevent the exhaust port 12 from moving toward the bellows member 46, thereby suppressing breakage of the reaction tube 11 (exhaust port 12).

According to the above-described embodiment, in the vertical heat treatment apparatus including the reaction tube 11 made of quartz, the bottom flange 31 for fixing the reaction tube 11 to the housing 10 and the flange member 52 for airtightly connecting the exhaust port 12 with the exhaust pipe 41a fixed to the housing 10 are fixed to each other by the shafts 71. Further, the shafts 71 are configured such that the length dimension and direction with respect to the bottom flange 31 and the flange member 52 can be adjusted in order to fix the bottom flange 31 and the flange member 52 to each other according to the posture of the exhaust port 12 with respect to the reaction tube 11. Accordingly, it is possible to prevent stress from being applied to the thermally bonded portion of the exhaust port 12 and the reaction tube 11, thereby suppressing breakage of the reaction tube 11.

Further, since the bottom flange 31 and the flange member 52 are fixed to each other, even though the inside of the reaction tube 11 is set in a vacuum atmosphere, it is possible to prevent the exhaust port 12 from being pulled toward the exhaust pipe 41a. Accordingly, since the expansible, contractible, and bendable bellows member 46 can be interposed close to the exhaust port 12 between the support portions 40 of the first exhaust pipe 41a and the exhaust port 12, it is possible to easily and quickly perform an installation operation of the exhaust port 12 to the exhaust pipe 41a.

Further, in connecting the exhaust port 12 to the exhaust pipe 41, two connection portions (between the exhaust port 12 and the flange member 52 and between the flange member 52 and the exhaust pipe 41a) are installed between the exhaust port 12 and the exhaust pipe 41. That is, there is only one connection portion in a conventional case (where the shafts 71 are not installed), whereas two connection portions are provided in this embodiment such that a partial member of the exhaust pipe 41 (plate-shaped member 53b) can be connected to the exhaust port 12 at a lower position than the heating furnace main body 19. Accordingly, since a fixing operation of the plate-shaped member 53b (flange member 52) and the shafts 71 to the reaction tube 11 can be performed at a lower position, the operation performed over the head of the operator is limited only to an operation of fixing the bendable, expansible, and contractible bellows member 46 and the flange portion 58 using the clamp member 44 and a fixing operation of the exhaust pipes 41a and 41b. Thus, it is possible to minimize the operations performed over the head of the operator, which are difficult due to the narrow space after the arrangement of the exhaust pipe 41a and the like, thereby easily and quickly performing an installation operation of the reaction tube 11. Therefore, since it requires a shorter period of time for installation or exchange of the reaction tube 11 compared to a case where the shafts 71 are not installed, this method increases the operation time of the apparatus.

Further, since the flange member 52 arranged on the lateral side of the exhaust port 12 is fixed to the bottom flange 31 by the shafts 71, the distance between the fixing portions fixed to the housing 10 on the front side of the exhaust port 12 (the side of the gas injector 21) and on the rear side of the exhaust port 12 (the side of the vacuum pump 43), i.e., a distance between the bottom flange 31 and the flange member 52, becomes much shorter than that when the shafts 71 are not installed (a distance between the bottom flange 31 and the support portions 40 of first exhaust pipe 41a). Further, in the case where the exhaust port 12 is fixed at a position deviated by a certain dimension in the fixing portion on the rear side of the exhaust post 12, the stress applied to the exhaust port 12 becomes smaller as the distance becomes shorter. That is, when the exhaust port 12 is fixed in a state deviated by a certain dimension in the fixing portion on the rear side, the connection portion of the reaction tube 11 and the exhaust port 12 becomes more deviated from its position as the distance becomes longer. Accordingly, it is possible to reduce the length dimension of the shafts 71 to a small value by using the flange member 52 as a portion for fixing the shafts 71 on the rear side. Accordingly, an allowable value for positional deviation in connecting the shafts 71 and the flange member 52 may be set to be larger than that when the shafts 71 are not installed. Thus, even in case of the reaction tube 11 or the exhaust port 12 formed of quartz having a larger dimension error than, e.g., a metal material, it becomes possible to perform an installation operation on the apparatus while reducing the dependence on the operator's skill and suppressing breakage of the reaction tube 11.

Also, since the shafts 71 are arranged at three locations, it is possible to further suppress breakage of the reaction tube 11. Further, the three shafts 71 are spaced from each other in the circumferential direction of the exhaust port 12 to face each other through the inner region of the exhaust port 12 without gathering only at one location of the exhaust port 12 (to be adjacent to each other). Thus, it is possible to further prevent a load applied to the flange member 52 from being transferred to the exhaust port 12.

Figure 18:
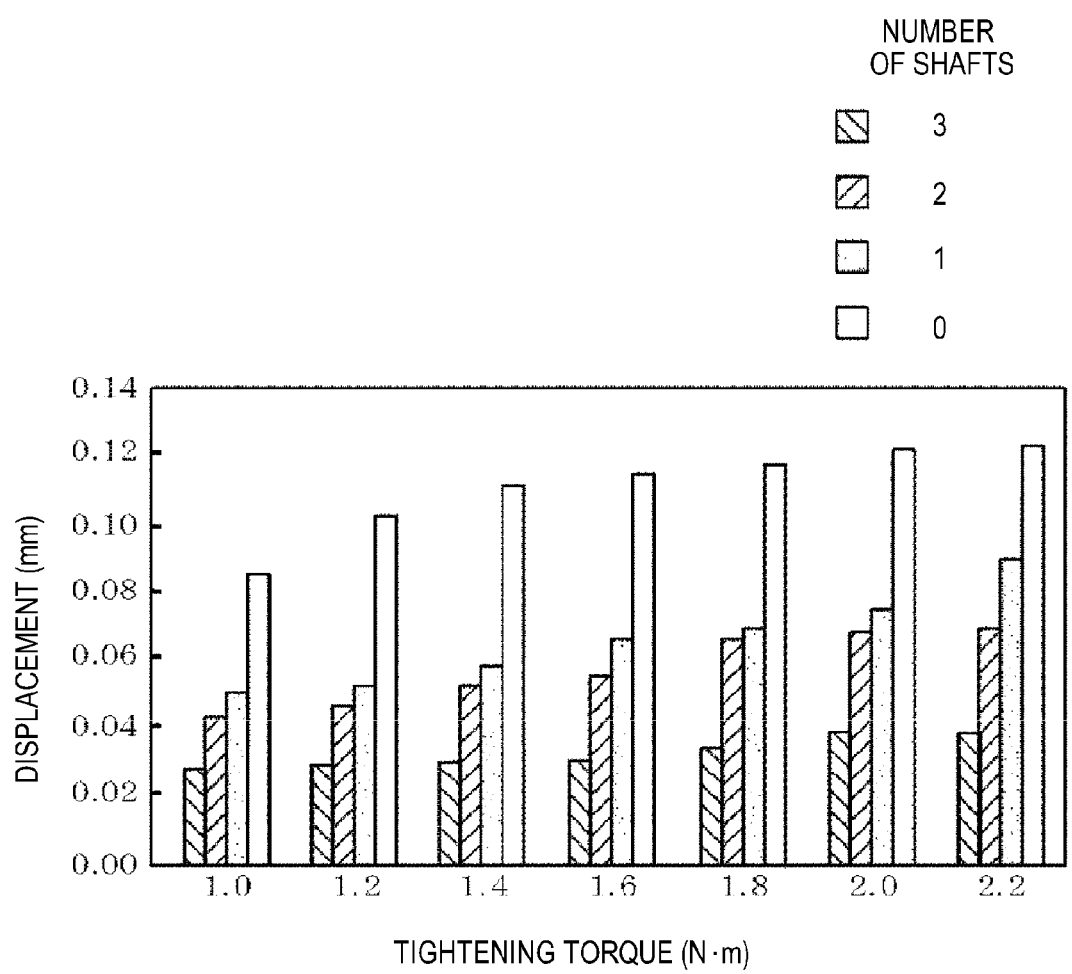
FIG. 18 illustrates the results of an evaluation of strength conducted in the vacuum processing apparatus.

FIG. 18 illustrates the results of measuring a load applied to the exhaust port 12 according to the presence/absence of the shafts 71 and the number of the shafts 71. In this case, a metal line which is not bendable was connected to the exhaust pipe 41a instead of the bellows member 46, and the displacement of the flange member 52 when a load was applied to the metal line was measured. The load applied to the metal line was calculated using a bolt tightening torque where bolts are fastened by a torque wrench when fixing the metal line to the housing 10 with a gap using the bolts. As a result, it can be seen that the exhaust port 12 (flange member 52) is difficult to move even though a load is applied to the metal line by installing the shafts 71 (i.e., the exhaust port 12 is difficult to break). Also, it can be seen that the exhaust port 12 becomes more difficult to break by increasing the number of the shafts 71. In FIG. 18, in the case of installing one shaft 71, the arrangement position of the shaft 71 was set to be −45° with respect to the direction in which a load was applied to the metal line when seen from the extending direction of the exhaust port 12. In the case of installing two shafts 71, the arrangement positions of the shafts 71 were set to be 225° and −45° with respect to the direction in which a load was applied to the metal line. In case of installing three shafts 71, the arrangement positions of the shafts 71 were set to be, as shown in FIG. 10, −45°45° and 225° with respect to the above-described direction.

Although, in the above-described embodiment, the bottom flange 31, the flange member 52 and the shafts 71 are sequentially mounted on the reaction tube 11 and the exhaust port 12 at a lower side of the heating furnace main body 19 and then the flange member 52 and the first exhaust pipe 41a are connected to each other at a higher position, they may be mounted as described in methods of (1) to (3) below. In the methods of (1) to (3), in the support portions 40, the exhaust pipe 41 may be fixed to the housing 10 in advance, or may be fixed to the housing 10 after installing (fixing) the reaction tube 11 and the exhaust port 12 on the apparatus.

(1) The bottom flange 31 is fixed to the reaction tube 11 at the lower position, and then the flange member 52 is fixed to the exhaust port 12 at the lower position or the higher position. Then, the shafts 71 are fixed between the bottom flange 31 and the flange member 52 at the higher position. Thereafter, the bottom flange 31 is fixed to the housing 10, and the flange member 52 and the first exhaust pipe 41a (bellows member 46) are connected to each other. In this case, the timing of fixing the bottom flange 31 to the housing 10 may be before or after connecting the flange member 52 with the exhaust pipe 41a as long as the reaction tube 11 is already raised to the higher position. Further, after the exhaust pipe 41 and the bottom flange 31 are fixed to the housing 10, the flange member 52 and the bellows member 46 may be fixed by using the shafts 71.

(2) At the lower position, the flange member 52 and the bottom flange 31 are sequentially mounted on the exhaust port 12 and the reaction tube 11. Then, the bottom flange 31 and the flange member 52 are fixed by using the shafts 71 at the lower position or the higher position. Then, while the bottom flange 31 is fixed to the housing 10, the flange member 52 and the bellows member 46 are connected to each other.

(3) While the bottom flange 31 is fixed to the reaction tube 11 at the lower position, the flange member 52 is fixed to the exhaust port 12 at the lower position or the higher position. Subsequently, at the higher position, the bellows member 46 and the flange member 52 are connected to each other, and the bottom flange 31 is fixed to the housing 10. Then, the bottom flange 31 and the flange member 52 are fixed by using the shafts 71. In this case, when the bellows member 46 and the exhaust port 12 are connected to each other, slight stress may be applied to the exhaust port 12 due to, e.g., the weight of the exhaust pipe 41a or the like. However, afterwards, the bottom flange 31 and the flange member 52 are fixed by using the shafts 71, so that the stress is transferred to the shafts 71, thereby suppressing breakage of the exhaust port 12 or the reaction tube 11. Further, in this case, the timing of fixing the bottom flange 31 to the housing 10 may be before driving the apparatus (before starting processing on the wafers W) and after the reaction tube 11 is lifted up to the higher position. Accordingly, the shafts 71 may be fixed last in a series of steps for installing the reaction tube 11.

Further, although the bellows member 46 is installed on the first exhaust pipe 41a in the above-described embodiment, the bellows member 46 may be omitted. In this case, in the method of (3), before the exhaust pipe 41a and the exhaust port 12 (flange member 52) are connected to each other, the support portion 40 of the exhaust pipe 41a is removed from the housing 10 in advance, the bottom flange 31 and the flange member 52 are fixed to each other by using the shafts 71, and then, the exhaust pipe 41a is fixed to the housing 10. Further, although the exhaust pipe 41a and the flange member 52 are installed as separate members, the exhaust pipe 41a and the flange member 52 may be formed integrally with each other. Even in this case, the flange portion of the exhaust pipe 41a (open end portion on the side of the exhaust port 12) and the exhaust port 12 are airtightly connected to each other.

Figure 19:
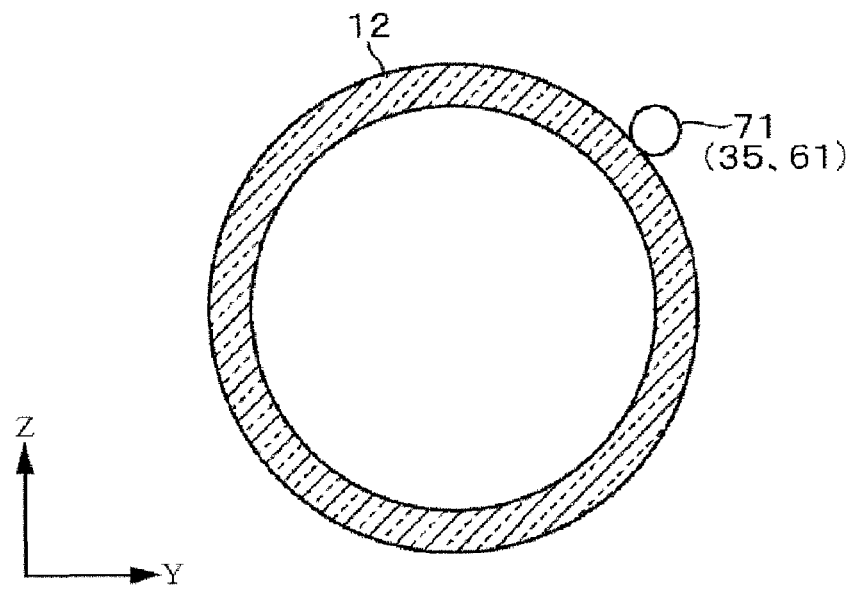
FIG. 19 is a longitudinal cross-sectional view showing another example of the exhaust pipe in the vacuum processing apparatus.
Figure 20:
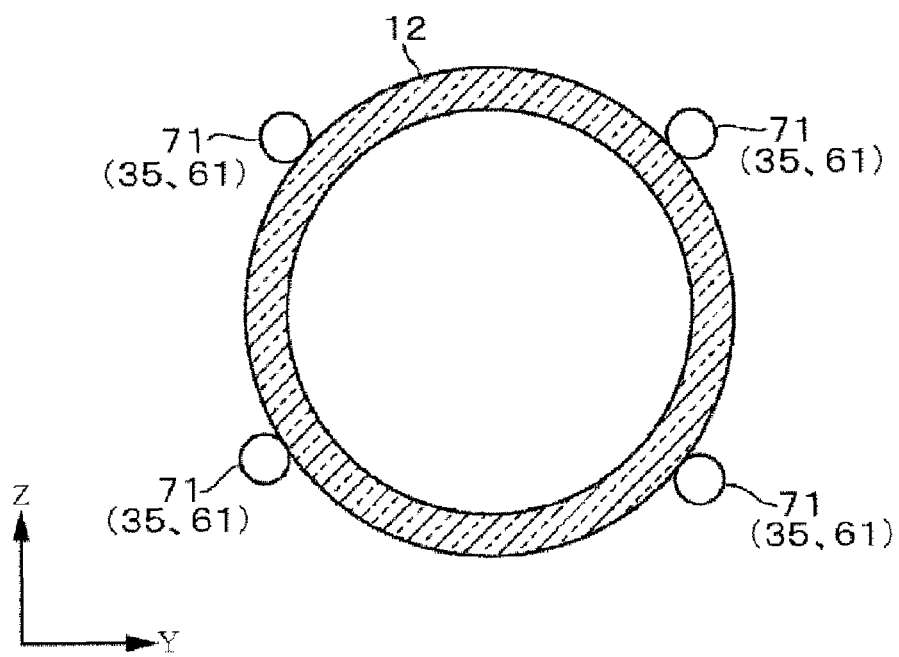
FIG. 20 is a longitudinal cross-sectional view showing another example of the exhaust pipe in the vacuum processing apparatus.
Figure 21:
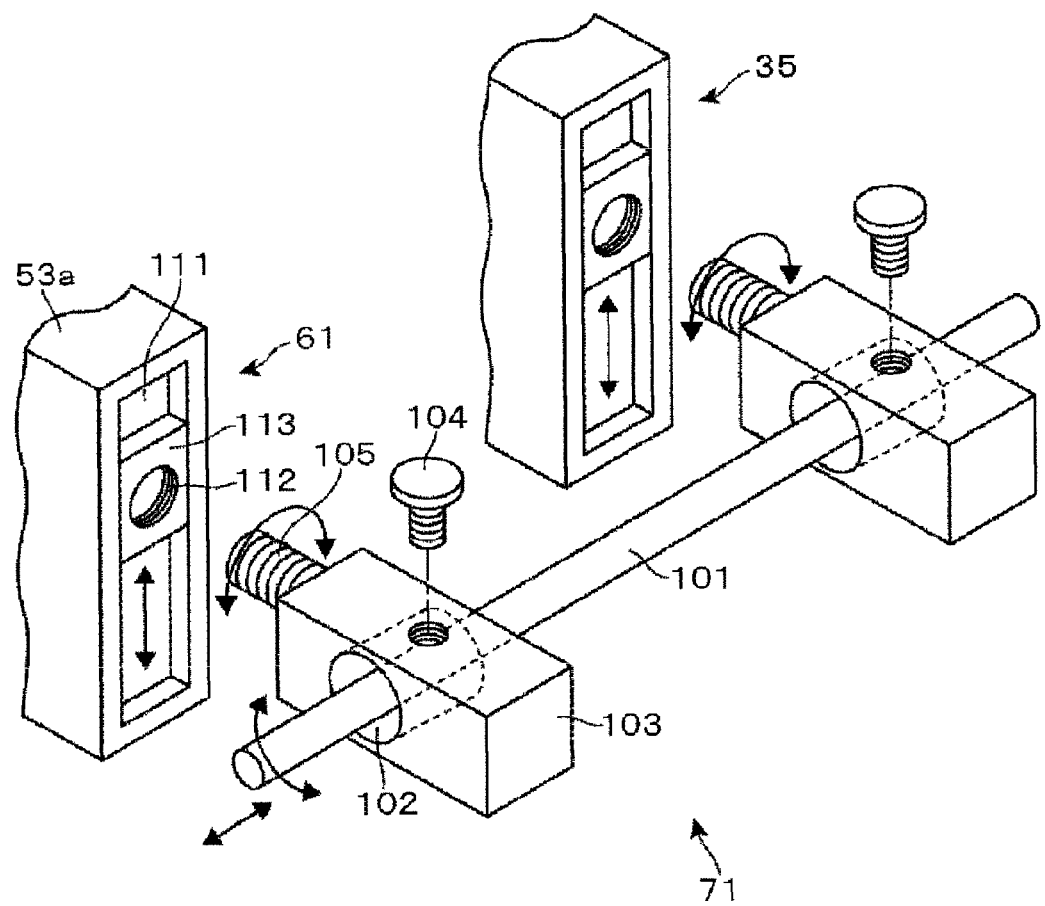
FIG. 21 is a perspective view showing another example of the shaft in the vacuum processing apparatus.

Although three shafts 71 are installed in the above-described embodiment, one shaft or two shafts may be installed as illustrated in FIG. 19, and four or more shafts may be installed as illustrated in FIG. 20. Further, any one of the shafts 71 may be configured such that the length dimension thereof is adjustable between the bottom flange 31 and the flange member 52 and the direction of the end portion is adjustable in the horizontal direction and vertical direction in each of the fixing portions 35 and 61. FIG. 21 illustrates another example of the shafts 71.

That is, each of the fixing portions 35 and 61 includes a guide groove 111 which is formed to be recessed in a vertical direction on the lateral side (side of the shaft 71) of the bottom flange 31 and the plate-shaped member 53a, and a slide member 113 which is slidable in the vertical direction in the guide groove 111 while being inserted and fitted into both side surfaces of the guide groove 111 and having a bolt hole 112 formed on the side facing the shaft 71. The slide member 113 may be fixed by a screw or the like from the lateral side to fix the height position thereof while being slid in the vertical direction.

Further, the shaft 71 includes a fixing shaft 101 having a rod shape and square shaped members 103 having through holes 102 on a lateral side to pass the fixing shaft 101 therethrough. The square shaped members 103 are formed such that an opening dimension of the through holes 102 is larger than a diameter dimension of the fixing shaft 101. Installed on the upper surfaces of the square shaped members 103 in a direction perpendicular to the through holes 102 are bolts 104 or the like to fix the fixing shaft 101 inserted into the through holes 102 from the upper surface side. Accordingly, the fixing shaft 101 is configured to be pivotable (direction is adjustable) on the plane (e.g., horizontal plane) on which the square shaped members 103 are arranged while being inserted into the square shaped members 103. Further, the square shaped members 103 include screw grooves 105 formed on the sides of the square shaped members 103 facing the fixing portions 35 and 61 to be inserted (fixed) into the bolt holes 112.

In this configuration, in the case of fixing the bottom flange 31 and the flange member 52 to each other, first, the screw grooves 105 of the square shaped members 103 are inserted into the bolt hole 112 via washers (not shown) or the like. While adjusting the height position of each of the slide member 113, the direction and position of each of the through holes 102 are adjusted. Then, the fixing shaft 101 is inserted into the through holes 102 and the fixing shaft 101 is fixed with respect to the square shaped members 103. By configuring the shafts 71 as described above, it is possible to adjust the positions of both end portions of the fixing shaft 101 respectively fixed to the square shaped members 103 (length dimension of the fixing shaft 101 between the fixing portions 35 and 61) according to the length dimension between the fixing portions 35 and 61, i.e., the posture of the exhaust port 12 with respect to the reaction tube 11. Further, in the case where the posture of the exhaust port 12 with respect to the reaction tube 11 is changed in the vertical direction or the horizontal direction compared to its design, it is possible to vertically move the slide member 113 or pivot the fixing shaft 101 in the through holes 102 according to the posture.

In the flange member 52, the fixing portions 61 may be installed on the clamp member 44 or the plate-shaped member 53b on the side of the exhaust pipe 41 instead of the plate-shaped member 53a on the side of the exhaust port 12. That is, the shafts 71 may be arranged to fix an attachment member (bottom flange 31) for fixing the reaction tube 11 to the housing 10 to a portion of the exhaust pipe 41 for connecting the exhaust pipe 41 to the exhaust port 12. Accordingly, in the case where the fixing portions 61 are installed on the clamp member 44, the clamp member 44 forms a part of the exhaust pipe 41. Further, in fixing the reaction tube 11 to the housing 10 by the bottom flange 31, an intermediate position of the reaction tube 11 in the longitudinal direction may be supported from the lateral side.

Although the reaction tube 11 and the exhaust port 12 are airtightly fixed to each other by thermal bonding in the above-described embodiment, as a fixing method of the reaction tube 11 and the exhaust port 12, there may be used a method of airtightly fixing the reaction tube 11 and the exhaust port 12 integrally with each other, e.g., a welding method using low melting glass or the like. Further, in supplying a film forming gas into the reaction tube 11 from the gas injector 21, instead of forming a plurality of gas holes 21a in the vertical direction on the side surface of the gas injector 21, an upper end portion of the gas injector 21 may be bent downward in a U shape at a higher position of the wafer boat 13 and the film forming gas may be supplied from the gas holes 21a formed at the upper end portion.

According to the present disclosure, the attachment member fixed to one end portion of the reaction vessel to mount the reaction vessel on a supporting portion, and the portion of the exhaust pipe including at least the flange portion are fixed to each other by using the fixing members. Accordingly, when fixing the exhaust pipe to the exhaust pipe fixing portion, it is possible to prevent excessive stress from being applied to a base end portion of the exhaust port made of quartz, thereby suppressing breakage of the reaction vessel. Further, although a bellows is installed in the exhaust pipe, when the bellows is contracted in vacuumization (depressurization), excessive stress is prevented from being applied to the base end portion of the exhaust port. Accordingly, it is possible to employ a configuration in which the bellows is provided in the exhaust pipe, and in this case, there is an advantage in that an operation of fixing the exhaust pipe to the exhaust pipe fixing portion is easily performed.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An assembly method of a vacuum processing apparatus which performs a vacuum process on a substrate in a depressurized atmosphere in a reaction vessel being made of quartz and having one end portion open as a loading port of the substrate and an exhaust port formed at said one end portion, the method comprising:
   (a) mounting an attachment member on the one end portion of the reaction vessel;
   (b) connecting and fixing at least a flange portion of an exhaust pipe to the exhaust port;
   (c) fixing the attachment member to a portion of the exhaust pipe including at least the flange portion connected and fixed to the exhaust port by using fixing members after (a) mounting and (b) connecting and fixing;
   (d) fixing the attachment member to a support portion after (a) mounting the attachment member on the reaction vessel; and
   (e) fixing the exhaust pipe to an exhaust pipe fixing portion different from the attachment member at a lower position than a fixing position of the attachment member after completing (a) mounting to (d) fixing.

2. The method of claim 1, wherein the reaction vessel is a vertical reaction vessel into which a holding unit including a plurality of substrates stacked in a form of shelves is loaded from a lower end portion of the reaction vessel which is the one end portion, and
   the fixing members are fixed to the flange portion of the exhaust pipe, which is connected to the exhaust port.

3. The method of claim 1, wherein the flange portion is detachably installed on one end portion of the exhaust pipe, and
   (b) connecting and fixing the flange portion of the exhaust pipe to the exhaust port is fixing the flange portion to the exhaust port in a state where the flange portion is separated from the exhaust pipe,
   the method further comprising connecting and fixing the flange portion to one end portion of the exhaust pipe after (c) fixing the attachment member to the flange portion by using the fixing members; and
   (e) fixing the exhaust pipe to the exhaust pipe fixing portion is performed after connecting and fixing the flange portion to one end portion of the exhaust pipe.

4. The method of claim 1, wherein the fixing members are arranged in at least three locations to be spaced from each other around an axis extending in a longitudinal direction of the exhaust port, and
   each of the fixing members is arranged to face another one of the fixing members through an inner region of the exhaust port.

5. The method of claim 1, wherein the fixing members are configured such that a length dimension between the portion of the exhaust pipe and the attachment member is adjustable.

6. The method of claim 1, wherein a bellows member is interposed between a position at which the exhaust pipe is fixed to the exhaust pipe fixing portion and a position at which the exhaust pipe is fixed to the attachment member by using the fixing members.

7. The method of claim 1, wherein the fixing members are configured such that the angles of connection portions connected to a portion of the exhaust pipe and the attachment member respectively is adjustable.

8. An assembly method of a vacuum processing apparatus which performs a vacuum process on a substrate in a depressurized atmosphere in a reaction vessel being made of quartz and having one end portion open as a loading port of the substrate and an exhaust port formed at said one end portion, the method comprising:
   (a) mounting an attachment member on the one end portion of the reaction vessel;
   (b) connecting and fixing at least a flange portion of an exhaust pipe to the exhaust port;
   (c) fixing the attachment member to a support portion after (a) mounting the attachment member on the reaction vessel;
   (d) fixing the exhaust pipe to an exhaust pipe fixing portion; and
   (e) fixing the attachment member to a portion of the exhaust pipe including at least the flange portion connected and fixed to the exhaust port after completing (d) fixing,
   wherein a bellows member is interposed between a position at which the exhaust pipe is fixed to the exhaust pipe fixing portion and a position at which the exhaust pipe is fixed to the attachment member by using the fixing members.

* * * * *